US009819297B2

(12) United States Patent
Yamada et al.

(10) Patent No.: US 9,819,297 B2
(45) Date of Patent: Nov. 14, 2017

(54) POWER CONVERSION DEVICE, MOTOR INCLUDING THE SAME, AIR CONDITIONER HAVING THE MOTOR INCORPORATED THEREIN, AND VENTILATION FAN HAVING THE MOTOR INCORPORATED THEREIN

(75) Inventors: Michio Yamada, Tokyo (JP); Mineo Yamamoto, Tokyo (JP); Hiroyuki Ishii, Tokyo (JP); Tomoyuki Hasegawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 364 days.

(21) Appl. No.: 13/822,257

(22) PCT Filed: Feb. 14, 2011

(86) PCT No.: PCT/JP2011/053022
§ 371 (c)(1),
(2), (4) Date: Mar. 11, 2013

(87) PCT Pub. No.: WO2012/035791
PCT Pub. Date: Mar. 22, 2012

(65) Prior Publication Data
US 2013/0175012 A1 Jul. 11, 2013

(30) Foreign Application Priority Data

Sep. 15, 2010 (JP) .................................. 2010-207067

(51) Int. Cl.
*H02P 25/00* (2006.01)
*H02P 27/06* (2006.01)
(Continued)

(52) U.S. Cl.
CPC ............. *H02P 27/06* (2013.01); *F28F 1/00* (2013.01); *H02K 11/25* (2016.01); *H02K 11/33* (2016.01);
(Continued)

(58) Field of Classification Search
USPC .......................... 318/822, 722, 800, 400.08
See application file for complete search history.

(56) References Cited

U.S. PATENT DOCUMENTS 5,131,455 A * 7/1992 Tsuchiyama et al. ........ 165/240
5,490,584 A * 2/1996 Estaque ................... H02P 15/00
188/158

(Continued)

FOREIGN PATENT DOCUMENTS

EP 2056033 A1 5/2009
EP 2163768 A1 3/2010
(Continued)

OTHER PUBLICATIONS

Office Action dated Oct. 11, 2014 issued in the corresponding CN patent Application No. 201180044346.6 (and English translation).
(Continued)

*Primary Examiner* — Eduardo Colon Santana
*Assistant Examiner* — Iftekhar Mustafa
(74) *Attorney, Agent, or Firm* — Posz Law Group, PLC

(57) ABSTRACT

A power conversion device includes a printed circuit board, whose mounting surface is opposite to an annular surface formed by an annular stator that constitutes a motor, arranged to be separated from the annular surface with a predetermined distance, and mounted with a Hall element that detects a rotation position of a rotor of the motor on a mounting surface on a side of the stator; an inverter IC that is mounted on the mounting surface on the side of the stator of the printed circuit board to supply a high-frequency
(Continued)

current to the stator; and an overheat detection unit that is mounted on the mounting surface on the side of the stator of the printed circuit board and detects an overheated state of the inverter IC. When the overheat detection unit detects an overheated state, the inverter IC restricts or stops a current to be supplied to the stator.

13 Claims, 10 Drawing Sheets

(51) Int. Cl.
  *F28F 1/00* (2006.01)
  *H02K 11/25* (2016.01)
  *H02K 11/33* (2016.01)
  *H02K 29/08* (2006.01)
(52) U.S. Cl.
  CPC ......... *H01L 2224/45124* (2013.01); *H01L 2224/45144* (2013.01); *H01L 2224/45147* (2013.01); *H01L 2224/48091* (2013.01); *H01L 2224/48247* (2013.01); *H01L 2924/00011* (2013.01); *H01L 2924/1033* (2013.01); *H01L 2924/10253* (2013.01); *H01L 2924/10254* (2013.01); *H01L 2924/10272* (2013.01); *H01L 2924/13055* (2013.01); *H01L 2924/181* (2013.01); *H02K 29/08* (2013.01); *H02K 2211/03* (2013.01)

(56) References Cited

U.S. PATENT DOCUMENTS

| | | | |
|---|---|---|---|
| 6,211,635 B1 | 4/2001 | Kambe et al. | |
| 6,414,408 B1* | 7/2002 | Erdman et al. | 310/68 R |
| 2008/0198548 A1* | 8/2008 | Nakamura | H05K 7/20927 361/689 |

FOREIGN PATENT DOCUMENTS

| | | | | |
|---|---|---|---|---|
| EP | 2259419 A1 | 12/2010 | | |
| JP | 05-259666 A | 10/1993 | | |
| JP | 10-201280 A | 7/1998 | | |
| JP | 2000-188850 A | 7/2000 | | |
| JP | 2000188850 A | * 7/2000 | ............... H02K 3/50 |
| JP | 2002-343855 A | 11/2002 | | |
| JP | 2005-253165 A | 9/2005 | | |
| JP | 2005-333099 A | 12/2005 | | |
| JP | 2006-129568 A | 5/2006 | | |
| JP | 2008-187798 A | 8/2008 | | |
| JP | 2009-219268 A | 9/2009 | | |
| JP | 2009219268 A | * 9/2009 | ............ H02M 7/003 |
| JP | 2009-248864 A | 10/2009 | | |
| JP | 2009248864 A | * 10/2009 | ............... H02K 3/50 |
| JP | 2010-183797 A | 8/2010 | | |
| JP | 2010-187435 A | 8/2010 | | |
| JP | 2010183797 A | * 8/2010 | ............ H02M 7/003 |

OTHER PUBLICATIONS

Office Action dated Nov. 26, 2013 in the corresponding JP Application No. 2012-533879 (and partial English translation).
International Search Report of the International Searching Authority (JPO) dated Mar. 22, 2011 in the corresponding PCT international patent application No. PCT/JP2011/053022 (and English translation).
Office Action dated Feb. 27, 2014 in the corresponding Australian Application No. 2011303259.
Office Action dated Aug. 12, 2013 in the corresponding Australian Application No. 2011303259.
Extended European Search Report dated Sep. 21, 2016 in the corresponding EP application No. 11824804.6.

* cited by examiner

POWER CONVERSION DEVICE, MOTOR INCLUDING THE SAME, AIR CONDITIONER HAVING THE MOTOR INCORPORATED THEREIN, AND VENTILATION FAN HAVING THE MOTOR INCORPORATED THEREIN

CROSS REFERENCE TO RELATED APPLICATIONS

This application is a U.S. national stage application of PCT/JP2011/053022 filed on Feb. 14, 2011, and claims priority to, and incorporates by reference, Japanese Patent Application No. 2010-207067 filed Sep. 15, 2010.

TECHNICAL FIELD

The present invention relates to a power conversion device constituted by a power conversion circuit board using a semiconductor module, a motor including the same, an air conditioner having the motor incorporated therein, and a ventilation fan having the motor incorporated therein.

BACKGROUND

In recent years, downsizing of a package for sealing an integrated circuit (hereinafter, IC) has been improved, and a surface mount package has been frequently used. Particularly, an example in which the surface mount package is used for an IC mounted on a power conversion device within a motor has been increasing due to the demand for downsizing. However, because the IC used in the motor requires relatively large allowable power consumption, some techniques are necessary for mounting the IC due to heat dissipation thereof (see, for example, Patent Literature 1).

It is assumed that such surface mount ICs are mounted on a printed circuit board by reflow soldering (see, for example, Patent Literature 2).

CITATION LIST

Patent Literatures

Patent Literature 1: Japanese Patent Application Laid-open No. 5-259666 (Page 2, FIG. 1)
Patent Literature 2: Japanese Patent Application Laid-open No. 2005-333099 (Pages 3 and 4, FIG. 1)

However, a power conversion device described in Patent Literature 1 requires sheet-metal parts for heat dissipation, and soldering to a GND terminal of a printed circuit board is also required. Therefore, soldering is required separately from soldering at the time of producing the printed circuit board, thereby causing a problem such that the manufacturing cost increases.

Furthermore, as for an arrangement position of an IC on the printed circuit board, a positional relation between the IC and a metal plate needs to be taken into consideration, and thus there is a limitation on a mounting position. As a result, it is difficult to obtain a sufficient downsizing effect of the power conversion circuit board, the motor, and a device having the motor incorporated therein by surface mounting of the IC.

Further, when a Hall element is mounted on a side of a stator (a rotor) of a printed circuit board in order to detect a rotation position of the rotor by using the Hall element, and when a power element (an IC) that supplies an electric current to the stator is mounted on the same printed circuit board, the power element is installed on the opposite side to the stator so as to avoid fractures of the power element (the IC) due to heat generation of the stator. As a result, main elements are mounted in a mixed manner on mounting surfaces of the both sides of the printed circuit board, thereby causing another problem such that downsizing as the power conversion circuit board cannot be realized sufficiently.

In a power conversion device described in Patent Literature 2, an IC and a circuit board are coupled by reflow soldering, and thus the mechanical strength thereof decreases as compared to the mechanical strength of DIP (Dual In-line Package) or solder by hand soldering. Furthermore, in a case of power components (ICs) on the power conversion circuit board, the heat generation amount is larger as compared to a device such as a microcomputer, and a temperature rise around the power components (ICs) increases and a distortion of a soldered portion increases. At this time, there is a problem such that, due to a decrease of the mechanical strength of the solder and an increase of the distortion of the soldered portion, the life of the electrical coupling of the soldered portion due to thermal contraction around an IC lead directly becomes the life of the power conversion circuit board.

Further, the package size of the surface mount IC becomes small. If heat dissipation is not performed with respect to the same heat generation amount, a temperature rise of the element increases. In order to avoid element fractures due to the temperature rise, an operating range as the power conversion device becomes narrow. At this time, if it is attempted to decrease the temperature of the element by using a metal heat radiation fin, an insulation distance between a high-voltage lead and the heat radiation fin is required. For that purpose, the thickness of the package needs to be increased, and this necessity adversely affects on downsizing of the surface mount IC.

Furthermore, there are problems such that a work such as thread fastening is generally required for attaching the heat radiation fin. This work increases the machining cost. Furthermore, holes for thread fastening are also required on the IC package, which further increases the package size.

Further, when the surface mount IC is mounted on a side of a stator, which has a high ambient temperature due to heat dissipation of a motor, its operating range becomes narrow in order to avoid element fractures due to a temperature rise of the surface mount IC.

SUMMARY

The present invention has been achieved to solve the above problems, and an object of the present invention is to provide a power conversion device, which can prevent a decrease of an operating range of a motor while suppressing element fractures due to a temperature rise of a semiconductor element and can downsize a board to be mounted, a motor including the power conversion device, and an air conditioner having the motor incorporated therein.

There is provided a power conversion device according to an aspect of the present invention including: a circuit board, whose mounting surface is opposite to an annular surface formed by an annular stator that constitutes a motor, arranged to be separated from the annular surface with a predetermined distance, and mounted with a Hall element that detects a rotation position of a rotor of the motor on a mounting surface on a side of the stator; a semiconductor module that is mounted on the mounting surface on the side of the stator of the circuit board and supplies a high-frequency current to the stator; and an overheat detection unit that is mounted on the mounting surface on the side of the stator of the circuit board and detects an overheated state of the semiconductor module, wherein when the overheat detection unit detects an overheated state of the semiconductor module, the semiconductor module restricts or stops a current to be supplied to the stator.

According to the present invention, the power conversion device can be downsized by mounting a semiconductor module and the like on a side of a stator of a motor, and detecting an overheated state of the semiconductor module, thereby enabling to prevent a decrease of an operating range of the motor to be driven.

DETAILED DESCRIPTION

Exemplary embodiments of a power conversion device according to the present invention will be explained below in detail with reference to the accompanying drawings. The present invention is not limited to the embodiments.

First Embodiment (Configuration of Power Conversion Device 60 and Motor 61)

Figure 1:
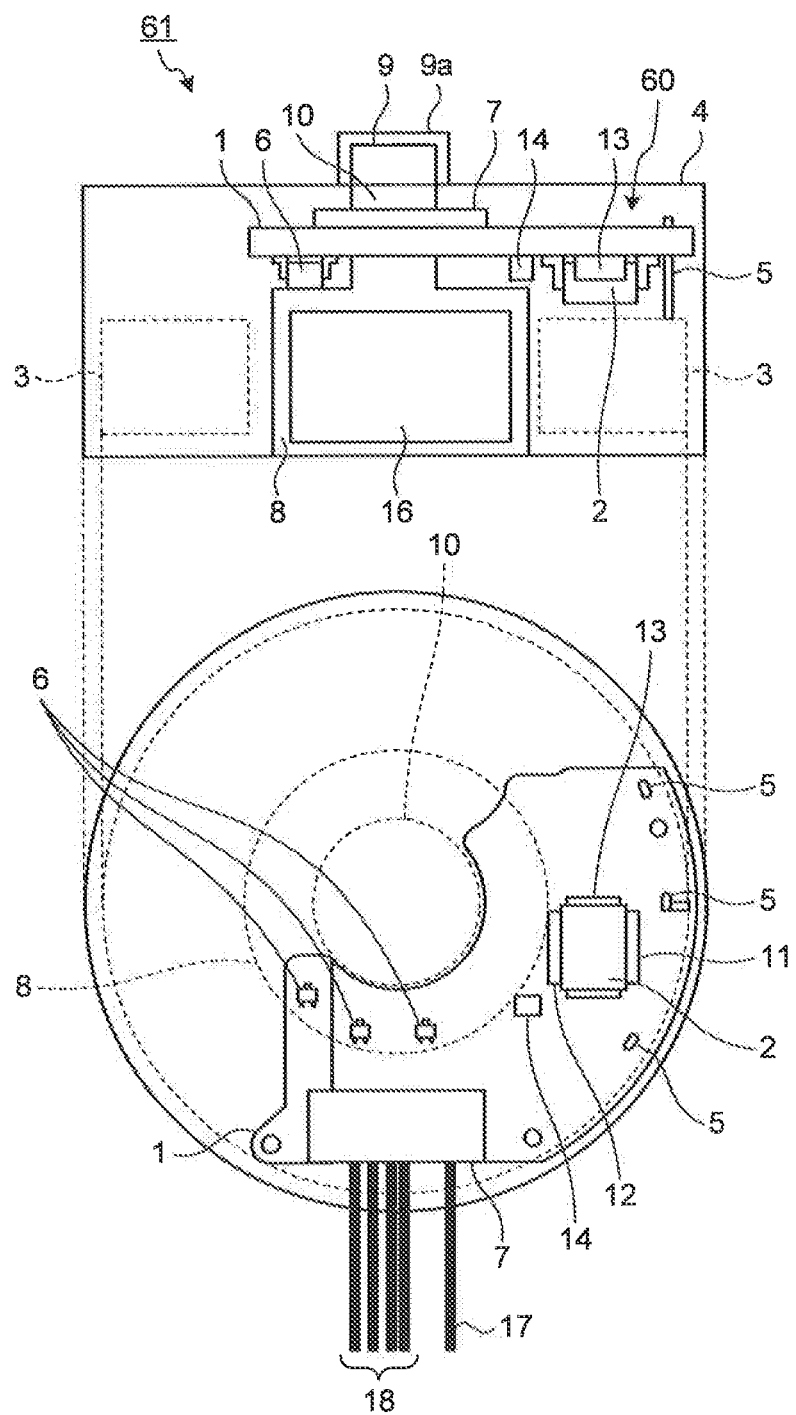
FIG. 1 is a side sectional view and a top perspective view of a power conversion device 60 and a motor 61 including the same according to a first embodiment of the present invention.

FIG. 1 is a side sectional view and a top perspective view of a power conversion device 60 and a motor 61 including the same according to a first embodiment of the present invention.

As shown in FIG. 1, a printed circuit board 1 mounted with a power conversion circuit for rotating and driving the motor 61 is included within the motor 61. Of the power conversion circuit, an inverter IC 2 including a main circuit of a voltage-type inverter for applying a voltage to a wire such as a copper wire or an aluminum wire of a stator 3 (described later) of the motor 61 is mounted on the printed circuit board 1. Furthermore, within the motor 61, on a side where the inverter IC 2 is mounted with respect to the printed circuit board 1, the annular stator 3 in which a wire is wound around a stator core is arranged. The stator 3 and the printed circuit board 1 are mechanically coupled by a mold resin 4, and a bearing housing 9a (described later) is formed, thereby forming an external shape of the motor 61.

The printed circuit board 1 and the stator 3 are electrically connected by motor terminals 5 by soldering so that a voltage is applied from the printed circuit board 1 to the stator 3. Furthermore, Hall elements 6 that detect a rotation position of a rotor 16 (described later) arranged to be surrounded by the stator 3 are mounted on a mounting surface of the printed circuit board 1 on a side of the stator 3. In order to electrically couple outside of the motor 61 to the printed circuit board 1 mounted with the power conversion circuit, an outside-motor connection lead 7 is installed on the printed circuit board 1. A high-voltage input line 17 and a low-voltage input line 18 are extended from the outside-motor connection lead 7.

The rotor 16, which is a rotator of the motor 61, is arranged in a rotor through hole 8 that is positioned within the annular stator 3 and is hollow cylindrically, without being filled with the mold resin 4. A bearing through hole 10 in communication with the rotor through hole 8 is further formed with respect to the printed circuit board 1, with a main shaft (not shown) of the rotor 16 passing through the mold resin 4 substantially vertically up to the bearing housing 9a. A bearing 9 is housed in the bearing through hole 10, and the bearing 9 is fitted to the main shaft of the rotor 16. An overheat detection element 14 that detects an overheated state of the inverter IC 2 is further installed near the inverter IC 2 on the printed circuit board 1.

As dual inline electrodes of the inverter IC 2, one is formed as high-voltage electrodes 11 and the other is formed as low-voltage electrodes 12. The high-voltage electrodes 11 receive inputs of a DC voltage obtained by rectifying a commercial power by full wave rectification or voltage doubler rectification outside the motor 61, and convert the DC voltage to a high-frequency voltage in the inverter IC 2 and output the high-frequency voltage to the motor terminals 5. The high-voltage electrodes 11 are arranged on a side of the motor terminals 5, so that the amount of wiring on the printed circuit board 1 becomes short.

As in the above configuration, the power conversion device 60 includes at least the printed circuit board 1, and the inverter IC 2, the motor terminals 5, the Hall elements 6, the outside-motor connection lead 7, and the overheat detection element 14 that are mounted on the printed circuit board 1.

The motor 61 includes at least the power conversion device 60 and the stator 3 that are mechanically coupled by the mold resin 4, the rotor 16, the bearing 9, and a main shaft (not shown) that couples the bearing 9 and the rotor 16.

The inverter IC 2 and the overheat detection element 14 respectively correspond to "semiconductor module" and "overheat detection unit" according to the present invention.

(Configuration of Inverter IC 2)

Figure 2:
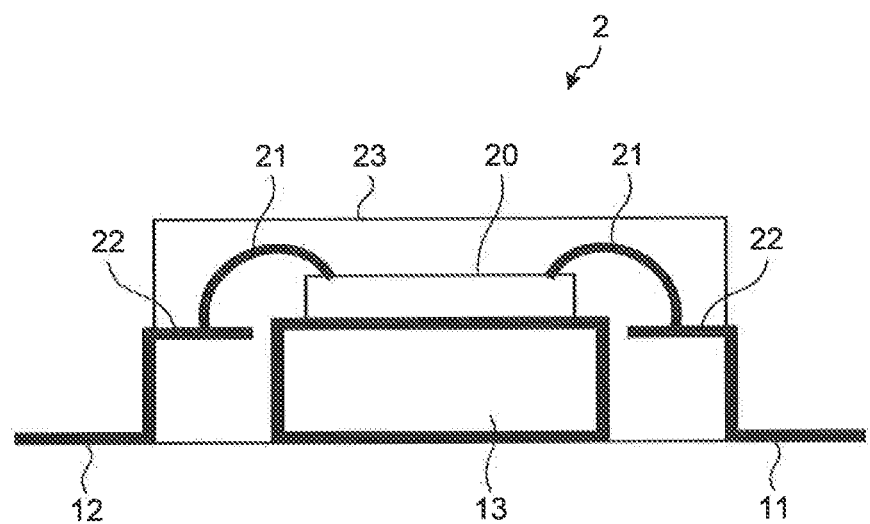
FIG. 2 is a configuration diagram of an inverter IC 2 mounted on the power conversion device 60 according to the first embodiment of the present invention.

FIG. 2 is a configuration diagram of the inverter IC 2 mounted on the power conversion device 60 according to the first embodiment of the present invention.

As shown in FIG. 2, in an IC chip 20 constituted by a wide gap semiconductor such as silicon or SiC, a metal electrodes formed on an upper surface thereof (aluminum lines 25 described later with reference to FIG. 3) and the high-voltage electrodes 11 and the low-voltage electrodes 12 formed by metal lead frames 22 are electrically coupled by bonding wires 21. The bonding wires 21 are formed of a metal wire material such as gold or aluminum, so that electrical coupling between the metal electrodes on the IC chip 20 and the metal lead frames 22 are achieved by ultrasonic fusion.

The metal lead frames 22 can be connected to the IC chip 20 by direct bonding that obtains electrical joints by direct contact with the semiconductor chip. The IC chip 20 is coupled onto a thick heat spreader 13 electrically, thermally, and mechanically by soldering or by a silver paste.

The IC chip 20, the bonding wires 21, and the metal lead frames 22 are covered with an IC package 23 formed of a highly thermally conductive resin, to form a main unit of the inverter IC 2. The main unit of the inverter IC 2 forms the inverter IC 2 together with the high-voltage electrodes 11 and the low-voltage electrodes 12, which are the dual inline electrodes extending from the main unit, and the heat spreader 13.

As in the above configuration, in the inverter IC 2, because the IC chip 20 is mounted on the heat spreader 13, transitional heat among heat generated from the semiconductor chip of the IC chip 20 is accumulated in the heat spreader 13, and a transitional temperature rise of the semiconductor chip can be suppressed. Furthermore, in the inverter IC 2, the heat spreader 13 having strong thermal coupling with the IC chip 20 is arranged close to the metal lead frames 22, and is further thermally coupled by the IC package 23, which is formed of a highly thermally conductive resin. Accordingly, steady heat generated in the IC chip 20 is dissipated to outside of the IC chip 20 from the high-voltage electrodes 11 and the low-voltage electrodes 12, via the metal lead frames 22.

The IC chip 20, the bonding wire 21, and the IC package 23 respectively correspond to "semiconductor chip", "metal wire", and "thermally conductive resin" according to the present invention.

(Configuration of IC Chip 20)

Figure 3:
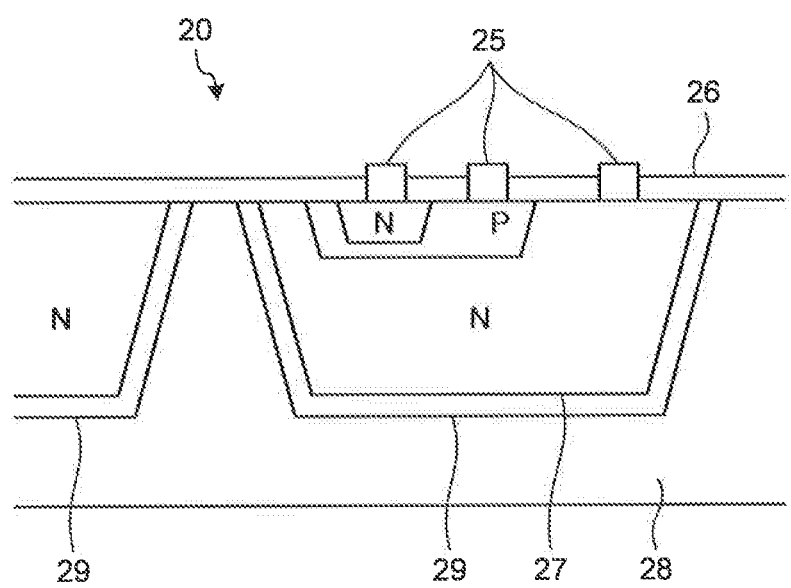
FIG. 3 is a configuration diagram of an IC chip 20 in the inverter IC 2 of the power conversion device 60 according to the first embodiment of the present invention.
Figure 4:
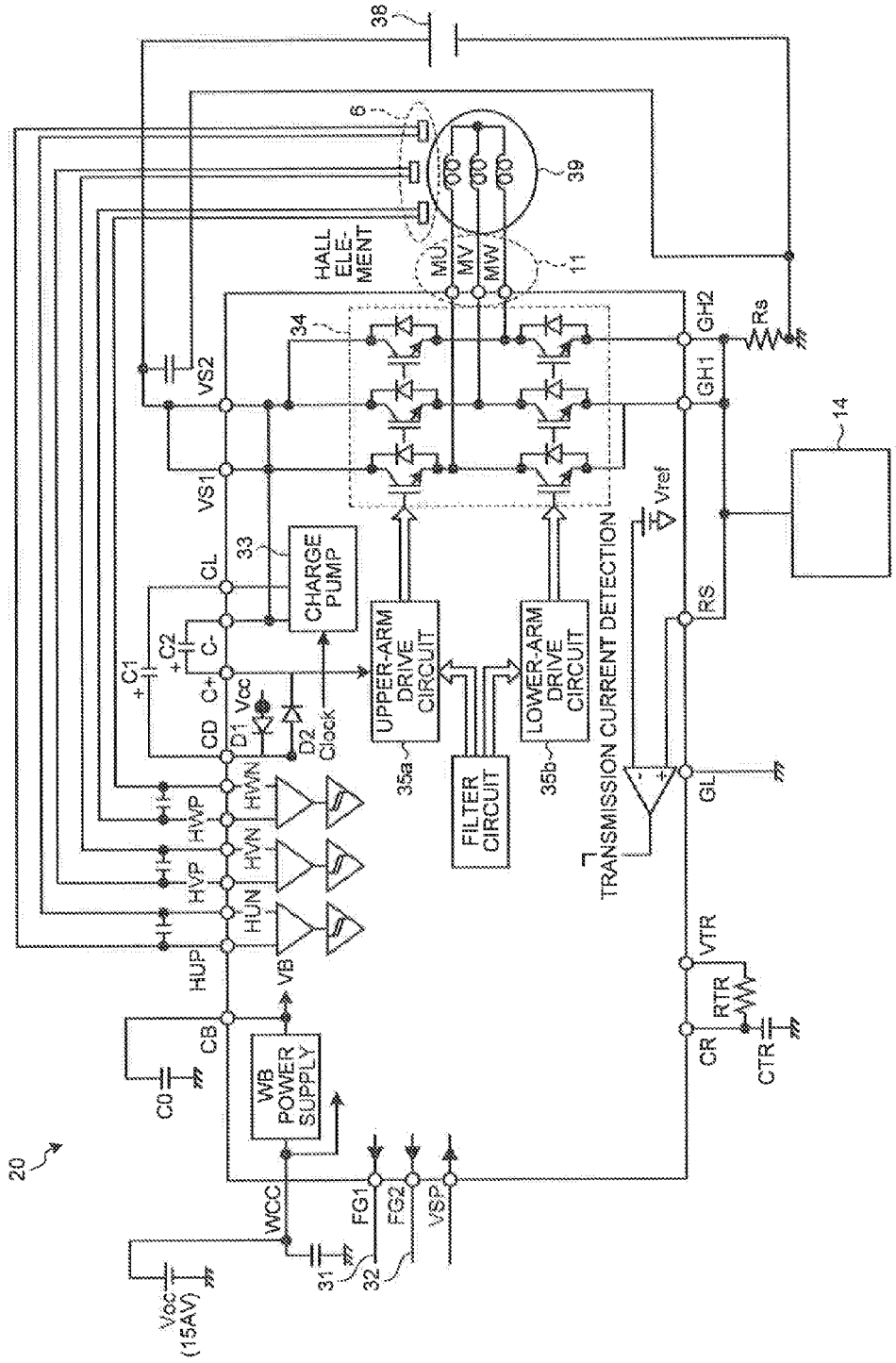
FIG. 4 is a circuit configuration diagram around the IC chip 20 in the inverter IC 2 of the power conversion device 60 according to the first embodiment of the present invention.

FIG. 3 is a configuration diagram of the IC chip 20 in the inverter IC 2 of the power conversion device 60 according to the first embodiment of the present invention. FIG. 4 is a circuit configuration diagram around the IC chip 20.

As shown in FIG. 3, on the IC chip 20, elements are formed on a silicon or SiC wide gap semiconductor chip by vapor deposition, and the aluminum lines 25 are formed, which electrically couple between the elements or between the elements and outside electrodes. On the IC chip 20, a silicon oxide film 26 is further formed for insulating between aluminum lines 25 or between semiconductor chip elements.

In the main unit of the IC chip 20, a plurality of semiconductor single crystalline islands 27 that form switching elements and the like by PN junction and the like are formed, and a polycrystalline silicon 28 that covers the circumference of the semiconductor single crystalline islands 27 and insulating separation layers 29 for achieving electrical insulation between the semiconductor single crystalline islands 27 and the polycrystalline silicon 28 are formed.

The aluminum lines 25 are electrically connected to the metal lead frames 22 by the bonding wires 21, as described above.

Furthermore, the polycrystalline silicon 28 in the IC chip 20 is electrically, thermally, and mechanically coupled to the heat spreader 13 as described above.

The insulating separation layers 29 are formed of silicon oxide ($SiO_2$) that can sufficiently ensure insulation performance even with a thin film.

As in the above configuration, in the IC chip 20, the semiconductor single crystalline islands 27 that constitute the semiconductor elements such as the switching elements can be arranged by being separated like islands on the same chip by the insulating separation layers 29 formed of silicon oxide having high insulation properties. This enables the switching elements that require high-voltage insulation to mount in a mixed manner. Furthermore, the main unit of the inverter IC 2 can be further downsized as compared to a normal IC in which a plurality of semiconductor chips are mounted on a plurality of metal lead frames while maintaining a predetermined insulation distance between the normal semiconductor chips. Further, in the IC chip 20, a low-voltage circuit can be formed on the same chip, and thus a low-voltage chip for control or a chip for high/low voltage separation is not required at outside. Further, these chips do not need to be electrically coupled by the metal lead frames 22 and wiring on the printed circuit board 1. With this configuration, the entire power conversion circuit and further the entire power conversion device 60 can be considerably downsized.

The aluminum lines 25 for acquiring electrical coupling with an external electrodes can be insulated by the silicon oxide film 26 having high insulation performance, which is formed on the IC chip 20. Therefore, as compared to an IC in which a plurality of semiconductor chips are arranged on metal lead frames and electrical coupling between the semiconductor chips is made by bonding wires, there is a flexibility in the arrangement of the aluminum lines 25 as the electrodes, and separation between the high-voltage electrodes 11 and the low-voltage electrodes 12 can be realized in a very small space.

The semiconductor single crystalline island 27 corresponds to "semiconductor element" according to the present invention.

As shown in FIG. 4, the DC voltage generated by full wave rectifying or voltage doubler rectifying a commercial power by a high-voltage DC power supply 38 outside the motor 61 is input to the IC chip 20 via the high-voltage electrodes 11. In the IC chip 20, the DC voltage is converted to a high-frequency voltage by six IGBTs 34 that are respectively formed using the semiconductor single crystalline islands 27 described above and on/off driven by an upper-arm drive circuit 35*a* and a lower-arm drive circuit 35*b*. The high-frequency voltage is applied to the wire of the stator 3 from the high-voltage electrodes 11 via the motor terminals 5. A Reflux diode is connected to each IGBT 34 in an anti-parallel manner.

A rotation position signal of the rotor 16 detected by the Hall elements 6 is converted to a low-voltage pulse signal by a logic circuit inside the IC chip 20, and output to outside from a rotation-number output line 31. In the IC chip 20, an output voltage of the inverter is adjusted by changing a switching pulse width of the six IGBTs 34, regarding the DC voltage supplied from the high-voltage DC power supply 38, based on a low-voltage analog signal voltage input from outside via an output-voltage-command input line 32. At this time, in the inverter constituted by use of the six IGBTs 34, the power supply of the upper-arm drive circuit 35a that drives the upper-arm IGBTs 34 is generated by a charge pump diode 33 and external capacitors C1 and C2. An opposite side of the wire of the stator 3 connected to the motor terminals 5, each of which is an input terminal of each phase in the motor 61, are electrically connected by a neutral point connection 39, and a star connection motor is formed.

The overheat detection element 14 converts a detected temperature to a resistance value by using a temperature resistance element having resistance characteristics with respect to changes of temperature being steep positive. The overheat detection element 14 outputs the resistance value as an input to an overcurrent protection terminal RS of the IC chip 20 in order to provide temperature characteristics to an overcurrent protection level. With this configuration, overheat detection element 14 detects an overheated state of the inverter IC 2, and detects that the inverter IC 2 and the stator 3 become the overheated state. In this case, the inverter IC 2 restricts or stops the current supplied to the stator 3 via the high-voltage electrodes 11, to prevent fractures of the inverter IC 2 and the like due to overheat.

Because the overheat detection element 14 as a positive-characteristic thermal resistance element having excellent temperature characteristics is formed of a ceramic material, the overheat detection element 14 cannot be formed on the IC chip 20. Furthermore, while it is conceivable to form the overheat detection element using a semiconductor on the IC chip 20, the element using the semiconductor has poor temperature characteristics and has variations. When this feature is taken into consideration, a design value of the protection level needs to be set low, and the output range of the motor 61 becomes considerably narrower as compared to a conventional configuration, in case of the low design value. Further, in the power conversion device 60 according to the present embodiment, the inverter IC 2 is arranged on the printed circuit board 1 on the side of the stator 3, which is a heat generation source causing a copper loss and an iron loss, which is disadvantageous in view of the temperature than being arranged on the opposite side to the stator 3.

Therefore, the overheat detection element 14 in the power conversion device 60 according to the present embodiment is arranged close to the heat spreader 13 having strong thermal coupling to the IGBTs 34 in the inverter IC 2. The overheat detection element 14 is also electrically and thermally coupled to the low-voltage electrodes 12 via a copper foil 50 (described later) with reference to FIG. 5. As shown in FIG. 1, the overheat detection element 14 is thermally coupled to the inverter IC 2 by the mold resin 4 having a low thermal resistance. Furthermore, the metal lead frames 22 as the low-voltage electrodes 12 are electrically and thermally coupled to the IC chip 20 by the bonding wires 21. By having such a configuration, the overheat detection element 14 can accurately detect the temperature of the IGBTs 34 that cause most of circuit losses and may lead to fractures due to overheat.

The six IGBTs 34 that constitute the inverter are arranged in an island form and respectively separated by the insulating separation layers 29 on the IC chip 20, which is the same silicon chip, and the IC chip 20 has strong thermal coupling to the heat spreader 13. Therefore, even if there are variations in heat generation in respective elements on the IC chip 20, because the respective elements are on the same solid, the respective elements have substantially the same temperature and temperature distribution can be smoothed. Furthermore, according to the above configuration, deterioration of temperature detection performance due to variations of the temperature distribution in the elements such as the IGBTs caused when the IGBTs are constituted by separate chips can be avoided. Further, a plurality of overheat detection elements do not need to be arranged in order to detect variations of the temperature in the respective elements, thereby enabling to reduce the cost.

As described above, it is possible to cover a decrease of an operating range of the motor 61 caused by a rise in the ambient temperature due to an arrangement of the inverter IC 2 on the side of the stator 3 on the printed circuit board 1, by improving the temperature detection performance of the overheat detection element 14 arranged on the side of the stator 3 on the printed circuit board 1. Particularly, in a one-chip IC such as the inverter IC 2, an ON voltage is higher (2.0 volts in a 600-volt voltage resistance class) than a single IGBT (for example, 1.6 volts), and has a larger steady loss. Accordingly, the above effect is large such that a power decline of the motor due to the operating range restricted for preventing fractures caused by a temperature rise of the IGBT can be covered.

The semiconductor single crystalline island 27 that constitutes the IGBT 34 in the IC chip 20 can be constituted by a wide bandgap semiconductor such as GaN (gallium nitride), SiC (silicon carbide), or diamond. The wide bandgap semiconductor has a high heat resistance and a voltage resistance, and also has a high allowable current density. Therefore, the IGBT 34 formed on the IC chip 20 can be downsized, and also the inverter IC 2 can be downsized. Furthermore, because the power loss is small, the IGBT 34 that can operate highly efficiently can be formed.

(Arrangement Configuration of Each Element on Printed Circuit Board 1 in Power Conversion Device 60)

Figure 5:
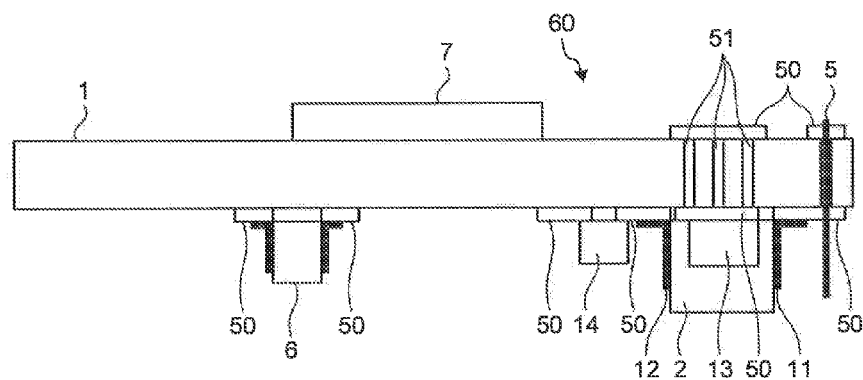
FIG. 5 is a sectional view of the power conversion device 60 according to the first embodiment of the present invention.

FIG. 5 is a sectional view of the power conversion device 60 according to the first embodiment of the present invention.

As shown in FIG. 5, the copper foil 50 in the power conversion device 60 is formed by a land for electrically, thermally, and mechanically coupling a circuit wiring pattern on the printed circuit board 1 or the printed circuit board 1 to components by solder. The Hall elements 6, the overheat detection element 14, and the inverter IC 2 are arranged via the copper foil 50 on the side of the stator on the printed circuit board 1. Specifically, in the inverter IC 2, the high-voltage electrodes 11 and the low-voltage electrodes 12 as the dual inline electrodes are coupled to the copper foil 50 by solder. Furthermore, as described above, the overheat detection element 14 is also electrically and thermally coupled to the low-voltage electrodes 12 via the same copper foil 50.

Through holes 51 pass through the printed circuit board 1 from the side of the stator 3 to the opposite side, and a surface of each hole is copper plated, to couple the copper foil 50 on the surface of the printed circuit board 1 on the side of the stator 3 and the copper foil 50 on the surface on the opposite side to each other electrically and thermally.

The motor terminals 5 are electrically connected to the high-voltage electrodes 11 of the inverter IC 2 on the side of the stator 3 from the copper foil 50 on the opposite side to the stator 3 on the printed circuit board 1 via the through hole 51, by melted string-like solder.

The outside-motor connection lead 7 is for electrically coupling the printed circuit board 1 to outside of the motor 61, and is mounted on the printed circuit board 1 not as a connector but as a lead. For example, when the motor 61 is incorporated in an air conditioner and the like, water may adhere to the outside of the motor 61. With this configuration, a short circuit due to water adhesion between the high-voltage and low-voltage electrodes in the case of the connector can be avoided, thereby enabling to ensure the reliability of the motor 61.

The copper foil 50 corresponds to "metal pattern" according to the present invention.

The heat spreader 13 in the inverter IC 2 is also electrically, thermally, and mechanically coupled to the copper foil 50 by solder, as in the high-voltage electrodes 11 and the low-voltage electrodes 12 as the dual inline electrodes. The heat spreader 13 is also thermally coupled to the copper foil 50 on the opposite side to the stator 3 on the printed circuit board 1, via the copper foil of the through hole 51. The surface mount inverter IC 2 has a larger package size as compared to the Hall elements 6 and the overheat detection element 14, and thus solder breakage is likely to occur by being largely affected by a thermal shrinkage stress at the time of molding and after molding of the peripheral mold resin 4. However, in the inverter IC 2, by mechanically coupling the heat spreader 13 strongly to the copper foil 50 by solder, the mechanical coupling strength to the printed circuit board 1 can be remarkably improved as compared to coupling only of the normal circuit electrodes (such as the high-voltage electrodes 11 and the low-voltage electrodes 12) by solder. Accordingly, the motor 61 molded by the mold resin 4 can include the power conversion device 60 therein. Furthermore, on the side of the stator 3 on the printed circuit board 1, the heat spreader 13 is thermally coupled to the copper foil 50 by solder, and is also thermally coupled to the copper foil 50 on the opposite side to the stator 3 via the through hole 51. Accordingly, heat generated by the inverter IC 2 can be dissipated to the opposite side to the stator 3 of the printed circuit board 1.

Further, a conventional inverter IC has been mounted on a printed circuit board on the opposite side to the stator, and therefore it has been advantageous in view of the ambient temperature of the inverter IC. However, in this case, the inverter IC or the heat spreader is arranged close to the bearing. Therefore, a voltage is generated between inner and outer rings of the bearing due to high-frequency noise caused by high-speed current change and voltage change by a high-frequency switching operation of the inverter IC, and due to consequent electric discharge, motor noise is generated by bearing damage (electrolytic corrosion phenomenon). However, as in the inverter IC 2 of the power conversion device 60 according to the present embodiment, because the inverter IC 2 is arranged on the side of the stator 3, the heat spreader 13 of the inverter IC 2 is arranged at a position away from the bearing 9. Accordingly, the motor 61 that hardly causes the electrolytic corrosion phenomenon can be acquired.

As described above, in the power conversion device 60 according to the first embodiment, the overheat detection element 14 and the inverter IC 2 are surface-mounted on the surface of the printed circuit board 1 on the side of the stator 3, where the Hall elements 6 need to be arranged for detecting positions of the magnetic poles of the rotor 16. In this manner, when the components are surface-mounted on the surface of the printed circuit board 1 on the side of the stator 3, the components can be electrically and mechanically coupled simultaneously by remelting of cream solder (reflow solder) applied to the copper foil 50. Furthermore, by surface-mounting the components on the surface of the printed circuit board 1 on the side of the stator 3 as described above, the solder does not need to be applied by using a metal mask on connection lands of the outside-motor connection lead 7 and the motor terminals 5 where the solder is applied after division of the printed circuit board 1 (described later) with reference to FIG. 6. At the time of remelting of the solder, the through holes 51 are not filled with the solder, and thus an attachment step and a removing step of a masking tape required so that the solder is not filled in the through holes 51 are not required separately. In this manner, soldering of the semiconductor element and the like on the circuit board can be facilitated to reduce the machining cost, and strong coupling between the circuit board and the semiconductor element and the like can be acquired.

As described above, the inverter IC 2 equipped with the thickest heat spreader 13 among the components mounted on the printed circuit board 1 can be surface-mounted on the printed circuit board on the side of the stator 3, by improving the temperature detection performance of the overheat detection element 14. Accordingly, there is a margin for the molding space on the opposite side to the stator 3 of the printed circuit board 1, and the stator 3 can be made thicker by the margin and the motor 61 having a large output can be acquired. Alternatively, if the printed circuit board 1 is thinned by the margin, a thin and compact motor 61 with the same output can be acquired.

An example in which the surface mount components such as the Hall elements 6, the overheat detection element 14, and the inverter IC 2 are soldered by reflow soldering on the printed circuit board 1 has been explained above. However, these surface mount components can be mounted on the printed circuit board 1 by using flow solder.

(Cutting Layout of Printed Circuit Board 1)

Figure 6:
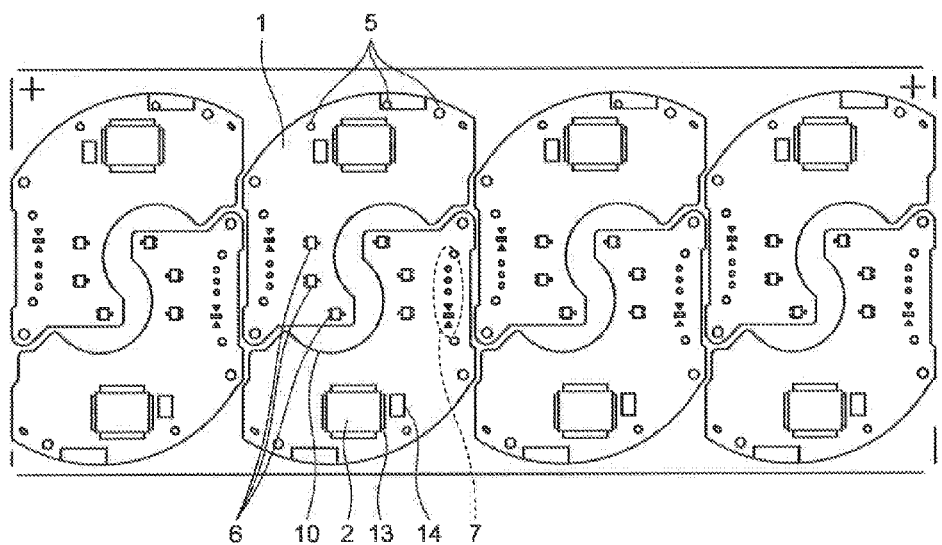
FIG. 6 depicts a cutting layout of a printed circuit board 1 in the power conversion device 60 according to the first embodiment of the present invention.

FIG. 6 depicts a cutting layout of the printed circuit board 1 in the power conversion device 60 according to the first embodiment of the present invention. FIG. 6 depicts a case where eight printed circuit boards 1 are molded from one substrate and surface mount components are mounted thereon.

On the printed circuit board 1 shown in FIG. 6, a package is downsized by using the inverter IC 2 in which the neutral point connection 39 in the stator 3 is not mounted and a plurality of high-voltage elements are accumulated on the IC chip 20 as a one-chip semiconductor. Accordingly, the printed circuit board 1 can be formed in an arc-shaped circuit board having a sectional area smaller than a half of the sectional area of the stator 3. At this time, the bearing through hole 10 can be also formed in a semi-circular shape.

Conventionally, a substrate portion corresponding to the bearing through hole 10 has been abandoned. On the other hand, in the present embodiment, in the substrate for forming the printed circuit boards 1, two semi-circular bearing through holes 10 of the two printed circuit boards 1 are crossed each other and arranged opposite to each other. Accordingly, the plurality of printed circuit boards 1 can be efficiently arranged, thereby enabling to improve the use efficiency of the substrate for forming the printed circuit boards 1.

When a circular bearing through hole is used as in a conventional printed circuit board, at the time of coupling electronic components on the printed circuit board by using flow solder, solder in a solder bath is blown and lifted through the bearing through hole. In order to prevent the lifting, it is required to block the bearing through hole before a flow soldering step, and a step of removing a plate for blocking the through hole is required after the soldering step. On the other hand, in the present embodiment, when soldering is performed by flow soldering, these steps can be eliminated and it is economical because not the circular bearing through hole but the semi-circular bearing through hole 10 is formed.

Effects of First Embodiment

As in the above configuration, in the inverter IC 2, the IC chip 20 in the inverter IC 2 mounted on the printed circuit board 1 is mounted on the heat spreader 13. Accordingly, transitional heat generated by the semiconductor chip in the IC chip 20 is accumulated in the heat spreader 13 and a transitional temperature rise of the semiconductor chip can be suppressed.

In the inverter IC 2, the heat spreader 13 having the strong thermal coupling to the IC chip 20 is arranged close to the metal lead frames 22, and is also thermally coupled by the IC package 23 that is a highly thermally conductive resin. Therefore, steady heat generated in the IC chip 20 can be dissipated to outside of the IC chip 20 from the high-voltage electrodes 11 and the low-voltage electrodes 12 via the metal lead frames 22.

In the IC chip 20, because the semiconductor single crystalline islands 27 that constitute the semiconductor elements such as the switching elements can be arranged by being separated like islands on the same chip by the insulating separation layers 29 formed of silicon oxide having high insulation properties, switching elements that require high-voltage insulation can be mounted in a mixed manner. Furthermore, the main unit of the inverter IC 2 can be further downsized as compared to an IC in which a plurality of normal semiconductor chips are mounted on the plurality of metal lead frames while maintaining a predetermined insulation distance between the semiconductor chips. Further, in the IC chip 20, because the low-voltage circuit can be formed on the same chip, the low-voltage chip for control or the chip for high/low voltage separation is not required at outside. Further, these chips do not need to be electrically coupled by the metal lead frames 22 and wiring on the printed circuit board 1. With this configuration, the entire conversion circuit as well as the entire power conversion device 60 can be considerably downsized.

The aluminum lines 25 for acquiring electrical coupling with the external electrodes can be insulated by the silicon oxide film 26 having high insulation performance, which is formed on the IC chip 20. Therefore, as compared to the IC in which a plurality of normal semiconductor chips are arranged on metal lead frames and electrical coupling between the semiconductor chips is achieved by bonding wires, there is a flexibility in the arrangement of the aluminum lines 25 as the electrodes, and separation between the high-voltage electrodes 11 and the low-voltage electrodes 12 can be realized in a very small space.

Furthermore, the overheat detection element 14 is arranged close to the heat spreader 13 having strong thermal coupling to the IGBT 34 in the inverter IC 2, and is electrically and thermally coupled to the low-voltage electrodes 12 via the copper foil 50. The overheat detection element 14 is also thermally coupled to the inverter IC 2 by the mold resin 4 having a low thermal resistance. Further, the metal lead frames 22 as the low-voltage electrodes 12 are electrically and thermally coupled to the IC chip 20 by the bonding wires 21. Accordingly, the overheat detection element 14 can accurately detect the temperature of the IGBTs 34 that cause most of circuit losses and may lead to fractures due to overheat.

The inverter IC 2 can cover a decrease of the operating range of the motor 61 caused by a rise in the ambient temperature due to the arrangement thereof on the side of the stator 3 on the printed circuit board 1, by improving the temperature detection performance of the overheat detection element 14 arranged on the side of the stator 3 on the printed circuit board 1.

The six IGBTs 34 that constitute the inverter are arranged in an island form and respectively separated by the insulating separation layers 29 on the IC chip 20, which is the same silicon chip, and the IC chip 20 has strong thermal coupling to the heat spreader 13. Therefore, even if there are variations in heat generation in respective elements on the IC chip 20, because the respective elements are on the same solid, the respective elements have substantially the same temperature and temperature distribution can be smoothed. Furthermore, according to the above configuration, deterioration of the temperature detection performance due to variations of the temperature distribution in the respective elements such as the IGBTs when the IGBTs are constituted by separate chips can be avoided. A plurality of overheat detection elements do not need to be arranged in order to detect variations of the temperature in the respective elements, thereby enabling to reduce the cost.

The outside-motor connection lead 7 is mounted on the printed circuit board 1 not as a connector but as a lead. Accordingly, for example, when the motor 61 is incorporated in an air conditioner and the like, water may adhere to the outside of the motor 61. A short circuit due to water adhesion between the high-voltage and low-voltage electrodes in the case of the connector can be avoided, thereby enabling to ensure the reliability of the motor 61.

The heat spreader 13 in the inverter IC 2 is also electrically, thermally, and mechanically coupled to the copper foil 50 by solder, as in the high-voltage electrodes 11 and the low-voltage electrodes 12 as the dual inline electrodes. The heat spreader 13 is also thermally coupled to the copper foil 50 on the opposite side to the stator 3 on the printed circuit board 1, via the copper foil of the through holes 51. Accordingly, regarding the surface mount inverter IC 2 having a large package size in which solder breakage is likely to occur by being largely affected by a thermal shrinkage stress at the time of molding and after molding of the peripheral mold resin 4, the mechanical coupling strength to the printed circuit board 1 can be remarkably improved as compared to coupling by solder only of the normal circuit electrodes (the high-voltage electrodes 11 and the low-voltage electrodes 12). Accordingly, the motor 61 molded by the mold resin 4 can include the power conversion device 60 therein. Furthermore, on the side of the stator 3 on the printed circuit board 1, the heat spreader 13 is thermally coupled to the copper foil 50 by solder, and is also thermally coupled to the copper foil 50 on the opposite side to the stator 3 via the through holes 51. Accordingly, heat generated by the inverter IC 2 can be dissipated to the opposite side to the stator 3 of the printed circuit board 1.

Further, because the inverter IC 2 is arranged on the printed circuit board 1 on the side of the stator 3, the heat spreader 13 is arranged at a position away from the bearing 9, and thus the motor 61 that hardly causes the electrolytic corrosion phenomenon can be acquired.

Furthermore, because the overheat detection element 14 and the inverter IC 2 are surface-mounted on the surface of the printed circuit board 1 on the side of the stator 3, where the Hall elements 6 need to be arranged for detecting positions of the magnetic poles of the rotor 16, these can be electrically and mechanically coupled simultaneously by remelting of cream solder (reflow solder) applied to the copper foil 50. Further, by surface-mounting the components on the surface of the printed circuit board 1 on the side of the stator 3 as described above, the solder does not need to be applied by using a metal mask on the connection lands for the outside-motor connection lead 7 and the motor terminals 5 where the solder is applied after division of the printed circuit board 1. At the time of remelting of the solder, the through holes 51 are not filled with the solder, and thus the attachment step and the removing step of the masking tape required so that the solder is not filled in the through holes 51 are not required separately. In this manner, soldering of the semiconductor element and the like on the circuit board can be facilitated to reduce the machining cost, and strong coupling between the circuit board and the semiconductor element and the like can be acquired.

Further, the inverter IC 2 equipped with the thickest heat spreader 13 among the components mounted on the printed circuit board 1 can be surface-mounted on the printed circuit board on the side of the stator 3, by improving the temperature detection performance of the overheat detection element 14. Accordingly, there is a margin for the molding space on the opposite side to the stator 3 of the printed circuit board 1, and the stator 3 can be made thicker by the margin and the motor 61 having a large output can be acquired. Alternatively, if the printed circuit board 1 is thinned by the margin, a thin and compact motor 61 with the same output can be acquired.

On the printed circuit board 1, a package is downsized by using the inverter IC 2 in which the neutral point connection 39 in the stator 3 is not mounted and a plurality of high-voltage elements are accumulated on the IC chip 20 as a one-chip semiconductor. Accordingly, the printed circuit board 1 can be formed in an arc-shaped circuit board having a sectional area smaller than a half of the sectional area of an outer diameter of the stator 3, and the bearing through hole 10 can be also formed in a semi-circular shape. Accordingly, on a substrate for forming the printed circuit boards 1, two semi-circular bearing through holes 10 of the two printed circuit boards 1 can be crossed each other and arranged opposite to each other. Accordingly, the plurality of printed circuit boards 1 can be efficiently arranged, thereby enabling to improve the use efficiency of the substrate for forming the printed circuit boards 1.

Second Embodiment (Configuration of Air Conditioner 100)

Figure 7:
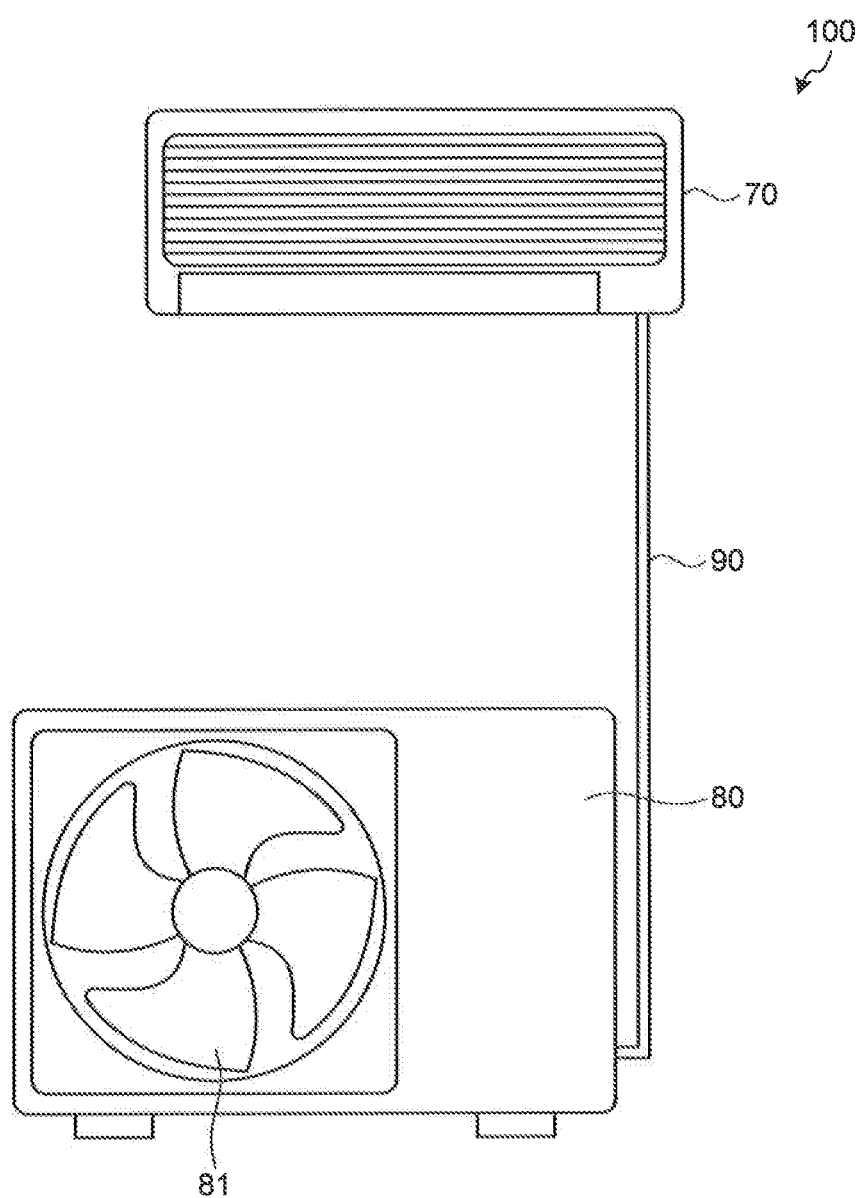
FIG. 7 is an overall outline view of an air conditioner 100 according to a second embodiment of the present invention.
Figure 8:
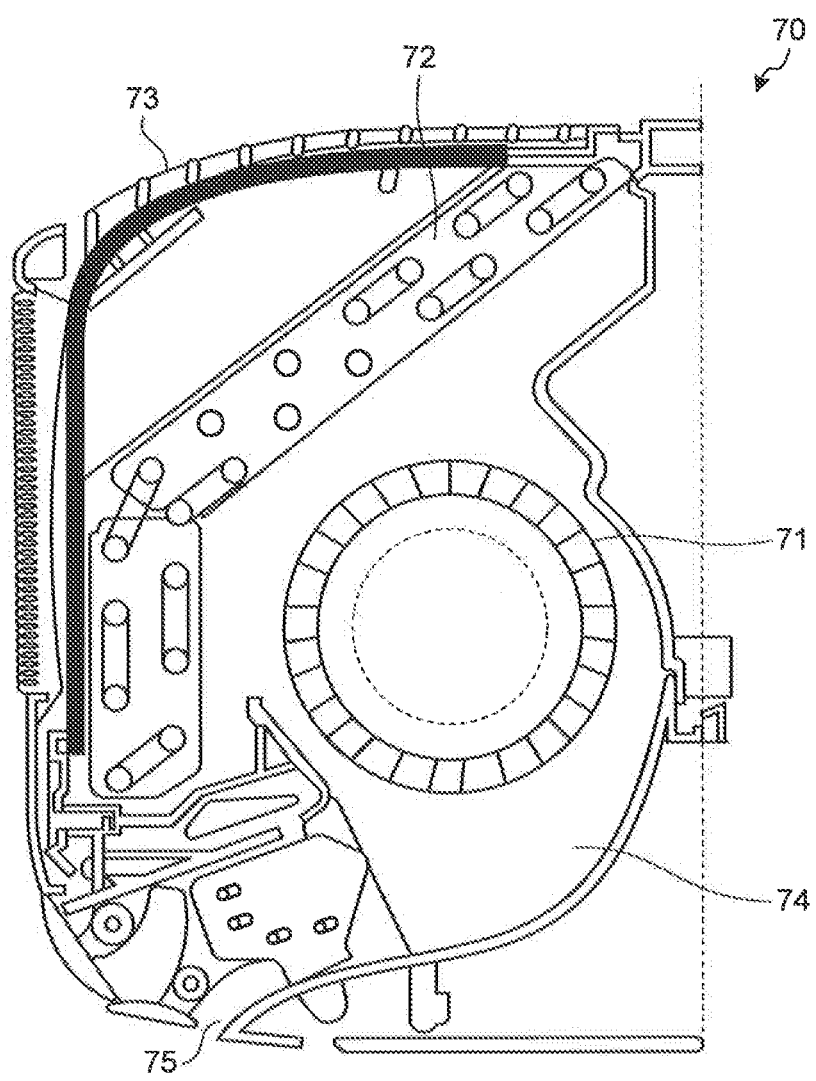
FIG. 8 is a cross-sectional view of an indoor unit 70 in the air conditioner 100 according to the second embodiment of the present invention.

FIG. 7 is an overall outline view of an air conditioner 100 according to a second embodiment of the present invention, and FIG. 8 is a cross-sectional view of an indoor unit 70 in the air conditioner 100.

In the air conditioner 100 shown in FIG. 7, the indoor unit 70 hung on a wall of a room is connected by a refrigerant pipe 90 to an outdoor unit 80 installed outside of the room. The indoor unit 70 includes an indoor blower 71 (described later), and an outdoor blower 81 is installed in the outdoor unit 80.

As shown in FIG. 8, within the indoor unit 70, an indoor heat exchanger 72 that performs heat exchange between indoor air and a refrigerant, and the indoor blower 71 that draws in the indoor air into the indoor unit 70 from a suction port 73 provided on an upper surface of the indoor unit 70, causes the indoor air to pass through the indoor heat exchanger 72 to create heat-exchanged conditioned air, and blows out the conditioned air into the room are fixed. The indoor heat exchanger 72 is folded and installed so as to surround the indoor blower 71. The indoor blower 71 is a line flow fan fixed so as to extend in a longitudinal direction of the indoor unit 70. The motor 61 including the power conversion device 60 according to the first embodiment that rotates the indoor blower 71 is connected to the indoor blower 71. A blowout air duct 74 through which the conditioned air passes is formed below the indoor blower 71, and a blowout port 75 for discharging the conditioned air passed through the blowout air duct 74 is provided at the bottom of the indoor unit 70.

(Basic Operation of Indoor Unit 70 of Air Conditioner 100)

A basic operation of the indoor unit 70 is explained next. When a user operates a remote control and the like to drive the air conditioner 100, the motor 61 connected to the indoor blower 71 rotates, and the indoor blower 71 rotates synchronously with the rotation thereof. The indoor air is drawn from the suction port 73 by the rotation of the indoor blower 71. The drawn indoor air passes through the indoor heat exchanger 72 by the continuous rotation of the indoor blower 71, and is heat-exchanged with the refrigerant circulating inside the indoor heat exchanger 72. The indoor heat exchanger 72 functions as an evaporator when the air conditioner 100 performs a cooling operation, and because the refrigerant within the indoor heat exchanger 72 is evaporated, the passing indoor air is cooled. On the other hand, the indoor heat exchanger 72 functions as a condenser when the air conditioner 100 performs a heating operation, and heats the indoor air passing therethrough. In this manner, the indoor air drawn into the indoor unit 70 is heat-exchanged by the indoor heat exchanger 72 at the time passing therethrough, to become conditioned air required by the user. The conditioned air having passed through the indoor heat exchanger 72 is blown out into the room from the blowout port 75 through the blowout air duct 74, due to the continuous rotation of the indoor blower 71. Further, by changing the number of rotation of the motor 61 connected to the indoor blower 71, the air volume of the blown out conditioned air is adjusted.

Effects of Second Embodiment

As in the above configuration, because the downsized motor 61 including the power conversion device 60 according to the first embodiment is connected to and mounted on the air conditioner 100, particularly the indoor blower 71 in the indoor unit 70, the indoor heat exchanger 72 can be downsized. Therefore, the air conditioner having high power saving performance can be obtained.

Furthermore, because the motor 61 including the power conversion device 60 according to the first embodiment is connected to and mounted on the air conditioner 100, particularly the indoor blower 71 in the indoor unit 70 to have high output characteristics, heat exchanging performance at the time of startup can be increased, and a set temperature can be reached in a short time to further improve user's comfortability. Because a wind speed can be increased by the high output of the motor 61, temperature variations in the room can be eliminated to further improve user's comfortability.

The configuration of the air conditioner 100 having the motor 61 shown in FIGS. 7 and 8 incorporated therein, the configuration of the indoor unit 70 in particular, is only an example, and is not limited to the exemplified configurations.

Furthermore, in the above descriptions, there has been explained a configuration in which the motor 61 including the power conversion device 60 according to the first embodiment is connected to the indoor blower 71 in the indoor unit 70; however, the present embodiment is not limited thereto, and a configuration in which the motor 61 is connected to the outdoor blower 81 in the outdoor unit 80 is also applicable.

Third Embodiment

Figure 9:
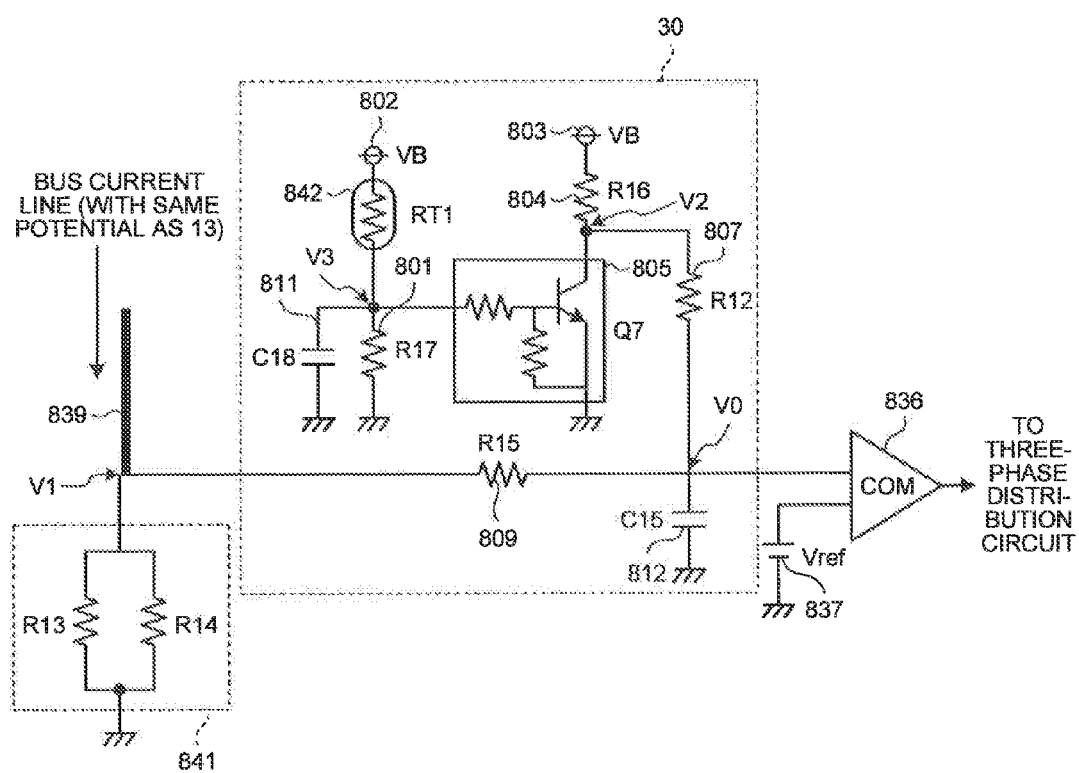
FIG. 9 is a peripheral circuit diagram of an overheat protection circuit 30 and a shunt resistance RS of a drive circuit included in a motor according to a third embodiment of the present invention.
Figure 10:
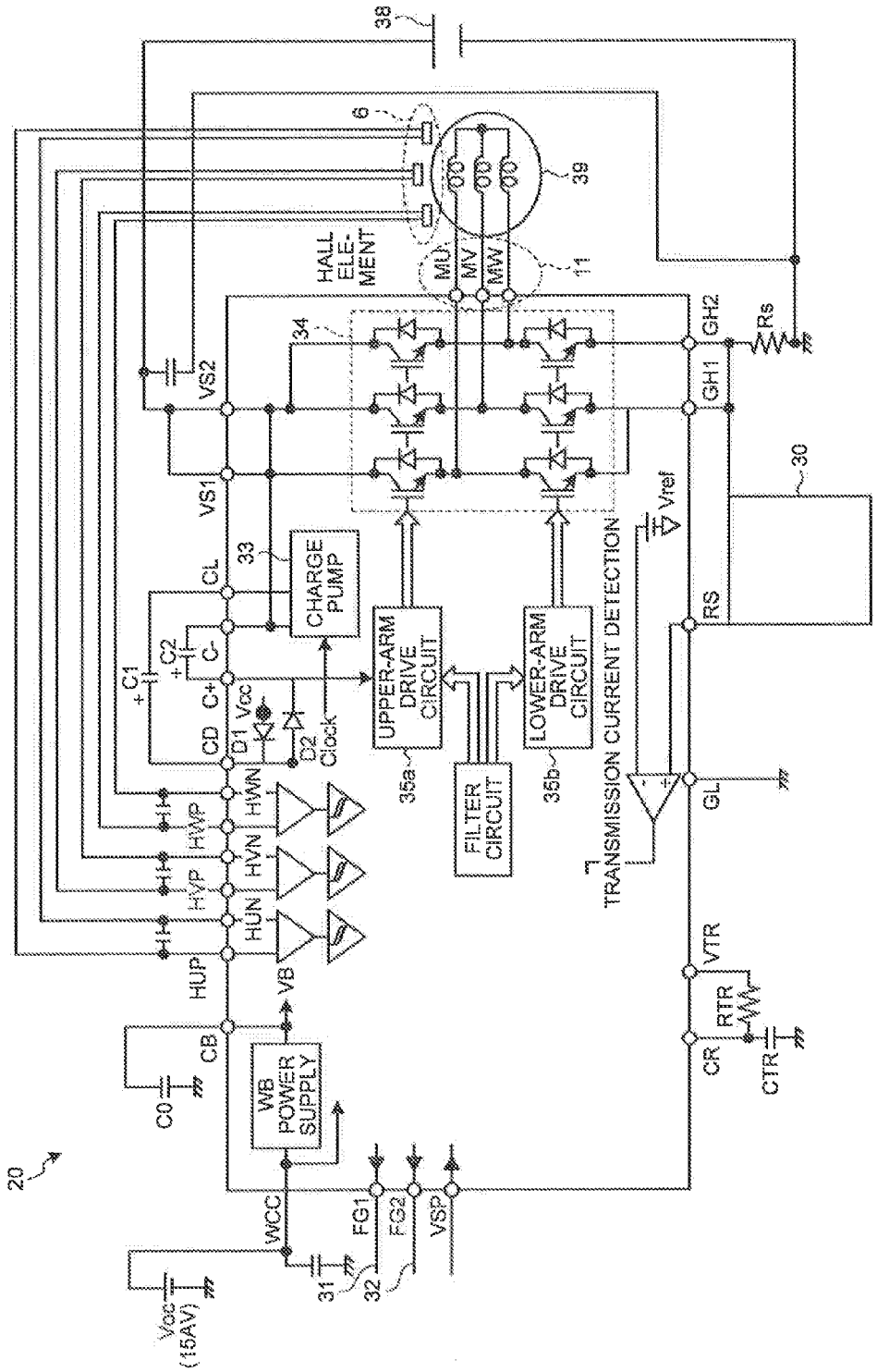
FIG. 10 is a circuit configuration diagram around the IC chip 20 in the inverter IC 2 of the power conversion device 60 according to the third embodiment of the present invention.

FIG. 9 is a peripheral circuit diagram of an overheat protection circuit 30 and a shunt resistance RS of a drive circuit included in a motor according to a third embodiment of the present invention. FIG. 10 is a circuit configuration diagram around the IC chip 20 in the inverter IC 2 of the power conversion device 60 according to the third embodiment of the present invention. In the circuit configuration diagram shown in FIG. 10, the overheat detection element 14 in the circuit configuration diagram shown in FIG. 4 is replaced by the overheat protection circuit 30, and other parts of the configuration are the same.

In FIG. 9, a bus-power supply line 839 connected to the inverter IC 2 is connected to a current detection resistance 841 in which a resistance R13 and a resistance R14 are connected in parallel. The current detection resistance 841 corresponds to a shunt resistance RS shown in FIG. 10, with the other end being grounded. A potential V1 between the current detection resistance 841 and the power supply line 839 becomes a potential V0 via a resistance R15 (809), and is connected to a comparison circuit 836. The spot of the potential V0 is grounded via a capacitor C15 (812).

One end of a thermal-sensitive resistance element RT1 (842) is connected to a reference voltage VB (802), and the other end has a potential V3 and is connected to a voltage dividing resistance R17 (801) and a capacitor C18 (811). The thermal-sensitive resistance element RT1 (842) is a surface-mount type thermal-sensitive resistance element having positive characteristics, and corresponds to the overheat detection element 14 shown in FIG. 1. Regarding a transistor including a resistance (a digital transistor) Q7 (805), a base side is connected to the reference voltage VB (802) via the thermal-sensitive resistance element RT1 (842), a collector side is connected to a reference voltage VB (803) via a resistance R16 (804), and an emitter side is grounded.

The reference voltage VB (802) and the reference voltage VB (803) have the same voltage. At this time, the reference voltage VB (803) is connected to the potential V0 via the resistance R16 (804) and a resistance R12 (807), and the potential V0 is introduced into the comparison circuit 836. A reference power supply 837 having a reference potential Rref is connected to the other input terminal of the comparison circuit 836. The comparison circuit 836 and the reference power supply 837 are included in the inverter IC 2.

Figure 11:
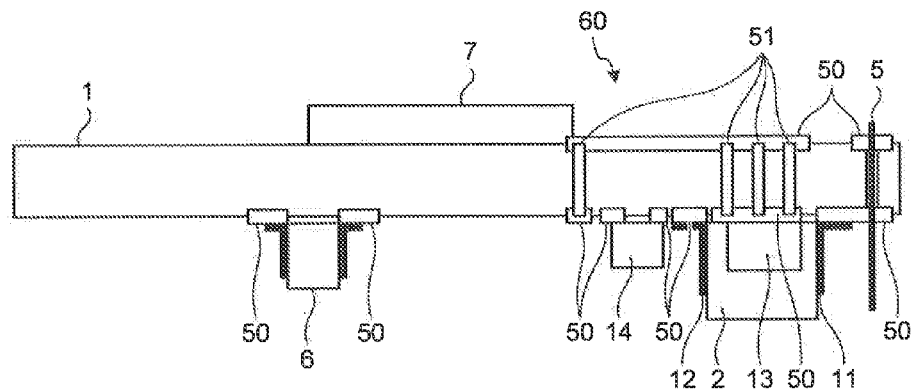
FIG. 11 is a sectional view of a circuit board of a drive circuit included in the motor according to the third embodiment of the present invention.

FIG. 11 is a sectional view of a circuit board of a drive circuit included in the motor according to the third embodiment of the present invention, and includes the overheat protection circuit 30 and the like explained with reference to FIGS. 9 and 10, and reference names of the respective parts are the same as shown in FIG. 5. In FIG. 11, the copper foil 50 thermally coupled to the heat spreader 13 of the inverter IC 2 strongly via the copper foil 50 and the through holes 51 is arranged on the opposite side to the mounting surface of the overheat detection element 14. Furthermore, the copper foil 50 thermally coupled strongly via the through hole 51 is arranged on the same surface side of the overheat detection element 14 from the copper foil 50 on the opposite side to the mounting surface of the overheat detection element 14.

Figure 12:
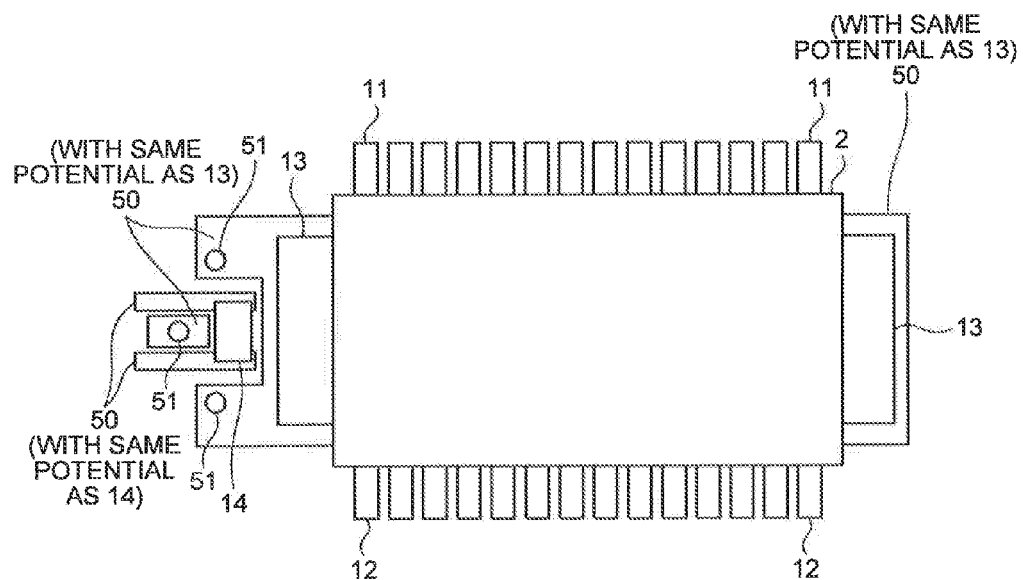
FIG. 12 is a top view around the inverter IC 2 and the overheat detection element 14 on the circuit board of a drive circuit included in the motor according to the third embodiment of the present invention.

FIG. 12 is a top view around the inverter IC 2 and the overheat detection element 14 on the circuit board of a drive circuit included in the motor according to the third embodiment of the present invention, and includes the overheat protection circuit 30 and the like explained with reference to FIGS. 9 and 10. The heat spreader 13 in the inverter IC 2 has thermally and electrically strong coupling to the copper foil 50 by reflow solder (not shown). The copper foil 50 is arranged to surround the overheat detection element 14. The copper foil 50 having thermally and electrically strong coupling to the heat spreader 13 in the inverter IC 2 (the copper foil 50 on the left side of the overheat detection element 14 in FIG. 12) due to a route of the through hole 51→the copper foil 50 on the back (shown in FIG. 11, but not shown in FIG. 12)→the through hole 51 is further arranged on the side face of the overheat detection element 14.

As in the above configuration, as shown in FIGS. 11 and 12, the overheat detection element 14 using a positive-characteristic thermal-sensitive resistance element in which the temperature characteristics have logarithmic characteristics is surrounded by the copper foil 50 having strong thermal coupling to the heat spreader 13 in the surface mount inverter IC 2 and the through holes 51. The output of the overheat detection element 14 is amplified by using the digital transistor Q7 (805). Accordingly, thermal protection is achieved without having a detection time difference and a detection temperature error, and the highly voltage-resistant inverter IC 2 using a surface mount package in which the package and the heat spreader 13 is small can be mounted on the side of the stator 3, which is a heating element, on the printed circuit board 1. Accordingly, the operating range of the motor and the device equivalent to a conventional case where a lead type inverter is arranged on a surface opposite to the side of the stator 3 and the overheat detection element 14 is arranged on a surface on the side of the stator 3 can be acquired.

Further, on the opposite side to the stator 3 where the mold resin 4 tends to be thinner than the side of the IC chip 20 of the inverter IC 2, the heat spreader 13 and the copper foil 50 form double metal barriers. Accordingly, the thin mold resin 4 on the opposite side to the stator 3 is not broken due to the energy at the time of a fracture of the IC chip 20, and a user can have a sense of security.

In the present embodiment, the through-hole type printed circuit board 1 is used. Therefore, the copper foil becomes thicker than a non-through-hole circuit board using a base material having the even foil thickness due to plating at the time of forming the through hole. Accordingly, stronger thermal coupling and metal barrier can be acquired. Furthermore, because the through holes 51 are present, stronger thermal coupling and metal barrier can be acquired. Further, it is needless to mention that, as the copper foil becomes thicker, the effect thereof increases. In addition, it is needless to mention that the effect becomes larger as the number and the size of through holes become larger.

Fourth Embodiment

Figure 13:
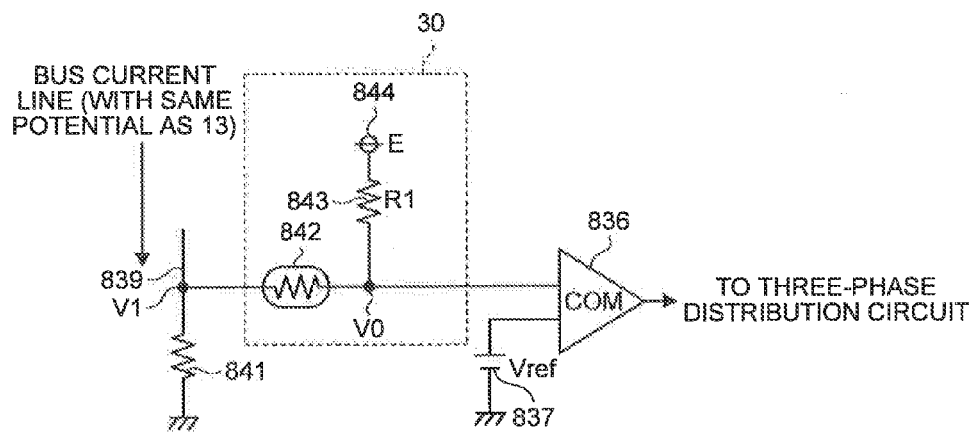
FIG. 13 is a peripheral circuit diagram of the overheat protection circuit 30 and the shunt resistance RS of a drive circuit included in a motor according to a fourth embodiment of the present invention.

FIG. 13 is a peripheral circuit diagram of the overheat protection circuit 30 and the shunt resistance RS of a drive circuit included in a motor according to a fourth embodiment of the present invention. While it is different from that explained in the third embodiment, the circuit configuration diagram around the IC chip 20 in the inverter IC 2 of the power conversion device 60 according to the fourth embodiment of the present invention is the same as that shown in FIG. 10.

The bus-power supply line 839 connected to the inverter IC 2 is connected to the current detection resistance 841 having a resistance value R. The current detection resistance 841 corresponds to the shunt resistance RS shown in FIG. 10, with the other end being grounded.

The thermal-sensitive resistance element 842 having a resistance value R0 is arranged parallel to the current detection resistance 841. The thermal-sensitive resistance element 842 is a surface-mount thermal-sensitive resistance element having positive characteristics, and corresponds to the overheat detection element 14 shown in FIG. 1. A potential V1 between the current detection resistance 841 and the power supply line 839 becomes a potential V0 via the thermal-sensitive resistance element 842 having the resistance value R0, and is connected to the comparison circuit 836. The spot of the potential V0 is connected to a common power supply 844 having a reference potential E via a resistance 843 having a resistance value R1. The reference power supply 837 having the reference potential Rref is connected to the other input terminal of the comparison circuit 836. The comparison circuit 836 and the reference power supply 837 are included in the inverter IC 2.

In the present embodiment, the metal heat spreader 13 in the inverter IC 2 uses cream solder or flow solder (not shown) and has thermally and electrically strong coupling to the bus-power supply line 839.

Figure 14:
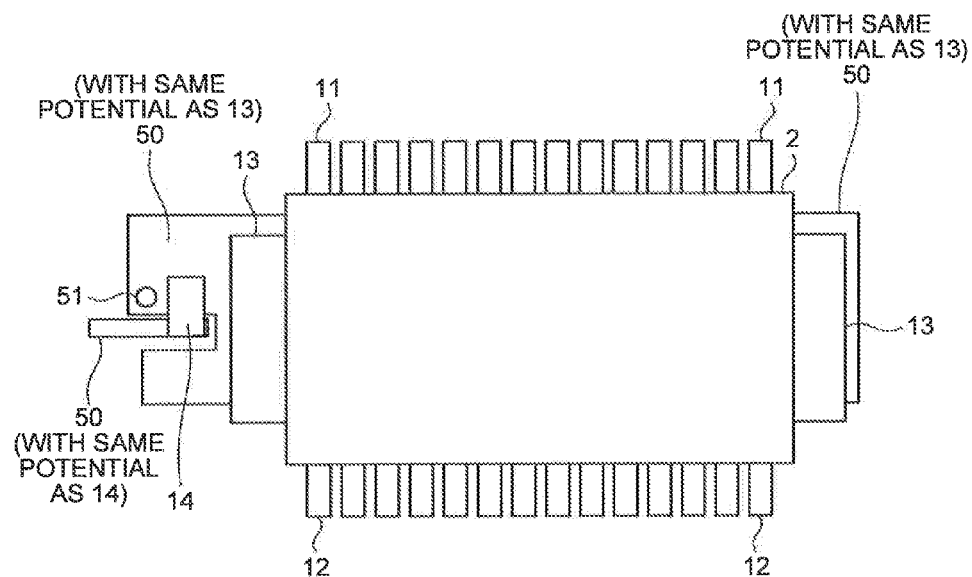
FIG. 14 is a top view around the inverter IC 2 and the overheat detection element 14 on a circuit board of a drive circuit included in the motor according to the fourth embodiment of the present invention.

FIG. 14 is a top view around the inverter IC 2 and the overheat detection element 14 on a circuit board of a drive circuit included in the motor according to the fourth embodiment of the present invention. The heat spreader 13 in the inverter IC 2 has thermally and electrically strong coupling to the copper foil 50 by the cream solder or flow solder (not shown). One terminal of the overheat detection element 14 is thermally and electrically coupled to the copper foil 50 having the same potential as the heat spreader 13 by solder (not shown). A part of the copper foil 50 is arranged below the overheat detection element 14.

As in the above configuration, the copper foil 50 and the through holes 51 having strong thermal coupling to the heat spreader 13 in the surface mount inverter IC 2 shown in FIG. 14 is directly and strongly coupled to the overheat detection element 14 thermally and electrically. The overheat detection element 14 adopts the positive-characteristic thermal-sensitive resistance element, in which the temperature characteristics have logarithmic characteristics shown in FIG. 13. Accordingly, thermal protection is achieved without any detection time difference and any detection temperature error, and the highly voltage-resistant inverter IC 2 using a surface mount package in which the package and the heat spreader 13 is small can be mounted on the side of the stator 3 as a heating element on the printed circuit board 1. Accordingly, the operating range of the motor and the device equivalent to a conventional case where the lead type inverter is arranged on the surface opposite to the side of the stator 3 and the overheat detection element 14 is arranged on the surface on the side of the stator 3 can be acquired.

Furthermore, the high-voltage DC power supply 38 according to the present invention uses a high-voltage power supply obtained by full wave rectifying or voltage doubler rectifying the commercial power. Therefore, fracture energy at the time of occurrence of a short circuit in the Si element chip has a magnitude far more powerful than that of a motor including therein a circuit, which uses a low-voltage power supply equal to or lower than 30 volts using a step-down power supply. If it is assumed that a resistance value at the time of occurrence of the short circuit is R, and the DC power supply is V, the amount of heat generated at the time of a fracture becomes $V^2/R$. The resistance at the time of occurrence of the short circuit is smaller in a high-voltage power element having a large chip sectional area, and even if it is the same, the power supply voltage has a difference of 5 to 10 times, and the fracture energy becomes 25 to 100 times larger. As a result, smoke generation, emission of light, and sound generation are likely to occur outside of the motor and the device, and its user is likely to have an uncomfortable feeling. Therefore, it is required not to cause any thermal fracture. In a safer device, even if an element fracture occurs, its user located outside of the device does not recognize any smoke generation, emission of light, and sound generation.

In the present embodiment, on the opposite side to the stator 3 where the mold resin 4 tends to be thinner than the side of the IC chip 20 of the inverter IC 2, the heat spreader 13 and the copper foil 50 form double metal barriers. Accordingly, the thin mold resin 4 on the opposite side to the stator 3 is not broken due to the energy at the time of a fracture of the highly voltage-resistant IC chip 20, which is used in the high-voltage DC power supply 38 in which the commercial power is rectified to cause smoke generation, emission of light, and sound generation, and thus its user can have a sense of security.

For the effect of the metal barrier, it suffices that the copper foil 50 of the printed circuit board 1 and the metal inside the inverter IC 2 are mechanically coupled, and it is needless to mention that, even if these are not coupled thermally or electrically, an identical effect can be achieved.

In the present embodiment, the through-hole type printed circuit board 1 is used. Therefore, the copper foil, due to plating at the time of forming the through hole, becomes thicker than a non-through-hole circuit board using a base material having the same foil thickness. Accordingly, stronger thermal coupling and metal barrier can be acquired. Furthermore, because the through holes 51 are present, stronger thermal coupling and metal barrier can be acquired. Further, it is needless to mention that, as the copper foil becomes thicker, the effect thereof increases. In addition, it is needless to mention that the effect becomes larger as the number and the size of through holes become larger.

In the present embodiment, the circuit, the motor, and the device can be constituted more inexpensively than in the third embodiment, because the amplifying transistor can be omitted.

In the third embodiment, the heat spreader 13 does not have any electrical coupling with other circuit patterns, and thus insulation performance between the power element and the low-voltage circuit can be further improved as compared to the fourth embodiment.

In the third and fourth embodiments, a one-chip inverter IC is used in the main circuit of the inverter. However, it is needless to mention that identical effects can be achieved even when a high-voltage surface-mount multi-chip inverter IC and discrete primary elements are used.

In the third and fourth embodiments, when a wide bandgap semiconductor having a high heat resistance and a low loss by use of SiC and C having a high heatproof temperature is adopted for primary elements, there is a margin larger than that in conventional primary elements using Si with respect to the detection time difference and the detection time delay. A negative-characteristic thermal-sensitive element having a small temperature-resistant characteristic change (a thermistor) can be used for the overheat detection element 14. Furthermore, when the positive-characteristic thermal-sensitive element is used, even if the thermal coupling level by the copper foil and the through holes is more decreased than that shown in the drawings, same effects can be achieved.

As the wide bandgap semiconductor, for example, silicon carbide and gallium nitride materials and diamond can be mentioned. The switching elements and diode elements formed by such a wide bandgap semiconductor have high voltage endurance and a high allowable current density, thereby enabling to downsize the switching elements and the diode elements. By using these downsized switching elements and diode elements, a semiconductor module having these elements incorporated therein can be downsized.

Furthermore, because a heat resistance is also high, the heat spreader 13 can be downsized. For example, a water cooling method can be changed to an air cooling method, and hence, further downsizing of the semiconductor module can be realized. Because the power loss is small, the switching elements and the diode elements can be used highly efficiently, which leads to highly efficient use of the semiconductor module.

It is desired that both the switching elements and the diode elements are formed by a wide bandgap semiconductor. However, any one of the switching elements and the diode elements can be formed by a wide bandgap semiconductor to achieve the effects described in the present embodiment.

In the embodiments described above, an example in which the thermal, electrical, and mechanical coupling between the elements and each metal is achieved by solder has been explained above. However, it is needless to mention that same effects can be achieved even when materials such as other types of metal and electroconductive resin are used.

In the embodiments described above, a double-face through-hole printed circuit board using the copper foil 50 is used for the printed circuit board 1. However, same effects can be also realized by achieving the thermal, electrical, and mechanical coupling between the elements and each metal by a base material formed of other types of metal or insulating material, or by using a circuit board in which a circuit is not formed by etching and the like.

In the above embodiments, an air conditioner has been explained as a device having a motor incorporated therein. However, even when the motor is incorporated in a ventilation fan, same effects such as making the device thinner and improvement of blower performance can be achieved. The improvement of blower performance is effective when the ventilation fan is used in a bathroom or a toilet, and is particularly effective when moisture and odor need to be eliminated in a short time.

The invention claimed is:

1. A power conversion device comprising:
 a circuit board placed separated from an annular surface of an annular stator of a motor and comprising a stator-side mounting surface opposed to the annular surface;
 a Hall element mounted on the stator-side mounting surface and configured to detect a rotation position of a rotor of the motor;
 a semiconductor module that is mounted on the stator-side mounting surface and supplies a high-frequency current to the stator;
 first and second metal patterns formed on the stator-side mounting surface of the circuit board; and
 an overheat detection unit that is mounted on the stator-side mounting surface of the circuit board, electrically and thermally coupled to an electrode of the semiconductor module through the first metal pattern formed on the stator-side mounting surface, and detects an overheated state of the semiconductor module, wherein:
 when the overheat detection unit detects an overheated state of the semiconductor module, the semiconductor module restricts or stops a current to be supplied to the stator,
 the semiconductor module includes a heat spreader soldered to the second metal pattern formed on the stator-side mounting surface,
 the second metal pattern is disposed adjacent to the first metal pattern in a spaced relationship with the first metal pattern,
 the overheat detection unit is surrounded by the second metal pattern in a spaced relationship with the second metal pattern,
 the circuit board has:
  an opposite-side mounting surface that is on an opposite side of the stator-side mounting surface; and
  a through hole passing through from the stator-side mounting surface to the opposite-side mounting surface and having a metal film formed therein, and
  the first and second metal patterns formed on the stator-side mounting surface are thermally coupled to a metal pattern formed on the opposite-side mounting surface via the through hole.

2. The power conversion device according to claim 1, wherein
 the semiconductor module further includes a semiconductor chip having a plurality of semiconductor elements and mounted on the heat spreader and thermally coupled thereto.

3. The power conversion device according to claim 2, wherein
 the semiconductor module is formed such that the heat spreader is arranged close to electrodes of the semiconductor module.

4. The power conversion device according to claim 2, wherein
 the heat spreader and the electrodes of the semiconductor module are thermally coupled by a thermally conductive resin, and
 the thermally conductive resin forms an external shape of the semiconductor module.

5. The power conversion device according to claim 2, wherein the heat spreader is thermally coupled to the second metal pattern.

6. The power conversion device according to claim 2, wherein
 the semiconductor elements are constituted by wide bandgap semiconductors.

7. The power conversion device according to claim 2, wherein
 the overheat detection unit is mounted on the circuit board close to the heat spreader of the semiconductor module.

8. The power conversion device according to claim 1, wherein the overheat detection unit and a semiconductor circuit including the semiconductor module are mounted on the stator-side mounting surface.

9. A motor comprising:

an annular stator;

a rotor arranged inside the stator; and the power conversion device according to claim 1, wherein the stator and the power conversion device are integrated by a mold resin that forms an outline of the motor.

10. A motor comprising:

a circuit board placed separated from an annular surface of an annular stator of a motor and comprising a stator-side mounting surface opposed to the annular surface;

a Hall element mounted on the stator-side mounting surface and configured to detect a rotation position of a rotor of the motor;

a semiconductor module that is mounted on the stator-side mounting surface and supplies a high-frequency current to the stator;

first and second metal patterns formed on the stator-side mounting surface of the circuit board; and an overheat detection unit that is mounted on the stator-side mounting surface of the circuit board, electrically and thermally coupled to an electrode of the semiconductor module through the first metal pattern formed on the stator-side mounting surface, and detects an overheated state of the semiconductor module, wherein:

the semiconductor module includes a heat spreader that is soldered to the second metal pattern formed on the stator-side mounting surface of the circuit board, and a semiconductor chip having semiconductor elements and mounted on the heat spreader and mechanically coupled thereto, the second metal pattern is disposed adjacent the first metal pattern in a spaced relationship with the first metal pattern, the overheat detection unit is surrounded by the second metal pattern in a spaced relationship with the second metal pattern, the stator, and the circuit board mounted with the Hall element and the semiconductor module are covered with a mold resin and integrated, the circuit board has:

an opposite-side mounting surface that is on an opposite side of the stator-side mounting surface; and a through hole passing through from the stator-side mounting surface to the opposite-side mounting surface and having a metal film formed therein, and the first and second metal patterns formed on the stator-side mounting surface are thermally coupled to a metal pattern formed on the opposite-side mounting surface via the through hole.

11. An air conditioner comprising:

an indoor unit that blows out conditioned air into a room where the air conditioner is installed;

an indoor blower that is installed within the indoor unit and discharges the conditioned air from a blowout port thereof; and an outdoor unit that is connected to the indoor unit by a refrigerant pipe and performs heat exchange with outside air, wherein the indoor blower has the motor according to claim 10 incorporated therein.

12. An air conditioner comprising:

an indoor unit that blows out conditioned air into a room where the air conditioner is installed;

an outdoor unit that is connected to the indoor unit by a refrigerant pipe and performs heat exchange with outside air; and an outdoor blower that is installed within the outdoor unit and feeds outside air into the outdoor unit, wherein the outdoor blower has the motor according to claim 10 incorporated therein.

13. A ventilation fan that blows out indoor air to outside the room, and has the motor according to claim 10 incorporated therein.

* * * * *